United States Patent
Cheung et al.

[11] Patent Number: 6,156,149
[45] Date of Patent: Dec. 5, 2000

[54] IN SITU DEPOSITION OF A DIELECTRIC OXIDE LAYER AND ANTI-REFLECTIVE COATING

[75] Inventors: David Cheung, Foster City; Judy H. Huang, Los Gatos; Wai-Fan Yau, Mountain View, all of Calif.

[73] Assignee: Applied Materials, Inc., Santa Clara, Calif.

[21] Appl. No.: 08/852,788

[22] Filed: May 7, 1997

[51] Int. Cl.[7] .................................................. B32B 31/00
[52] U.S. Cl. ................... 156/272.2; 156/274.4; 156/272.6; 118/705; 118/708; 118/712; 118/722; 427/255.7; 427/279; 438/763; 438/784; 438/788
[58] Field of Search .................................... 148/724, 725, 148/665, 722, 723, 712; 156/643, 272.2, 272.6; 438/763, 784, 788; 118/722, 699, 705, 708, 712, 50.1; 427/255.7, 579

[56] References Cited

U.S. PATENT DOCUMENTS

| | | | |
|---|---|---|---|
| 4,998,979 | 3/1991 | Nino | 134/1 |
| 5,261,961 | 11/1993 | Takasu et al. | 118/722 |
| 5,443,646 | 8/1995 | Yamada et al. | 118/722 |
| 5,661,093 | 8/1997 | Raui et al. | 438/763 |

*Primary Examiner*—Merrick Dixon
*Attorney, Agent, or Firm*—Townsend & Townsend & Crew

[57] ABSTRACT

This invention provides a method and apparatus for depositing a two-layer structure, including an antireflective coating and a dielectric layer, without any intervening process steps, such as a cleaning step. The invention is capable of providing more accurate and easier fabrication of structures by reducing inaccuracies caused by the reflection and refraction of incident radiant energy within a photoresist layer used in the patterning of the dielectric layer. Additionally, the antireflective coating of the present invention may also serve as an etch stop layer during the patterning of a layer formed over the antireflective coating.

19 Claims, 10 Drawing Sheets

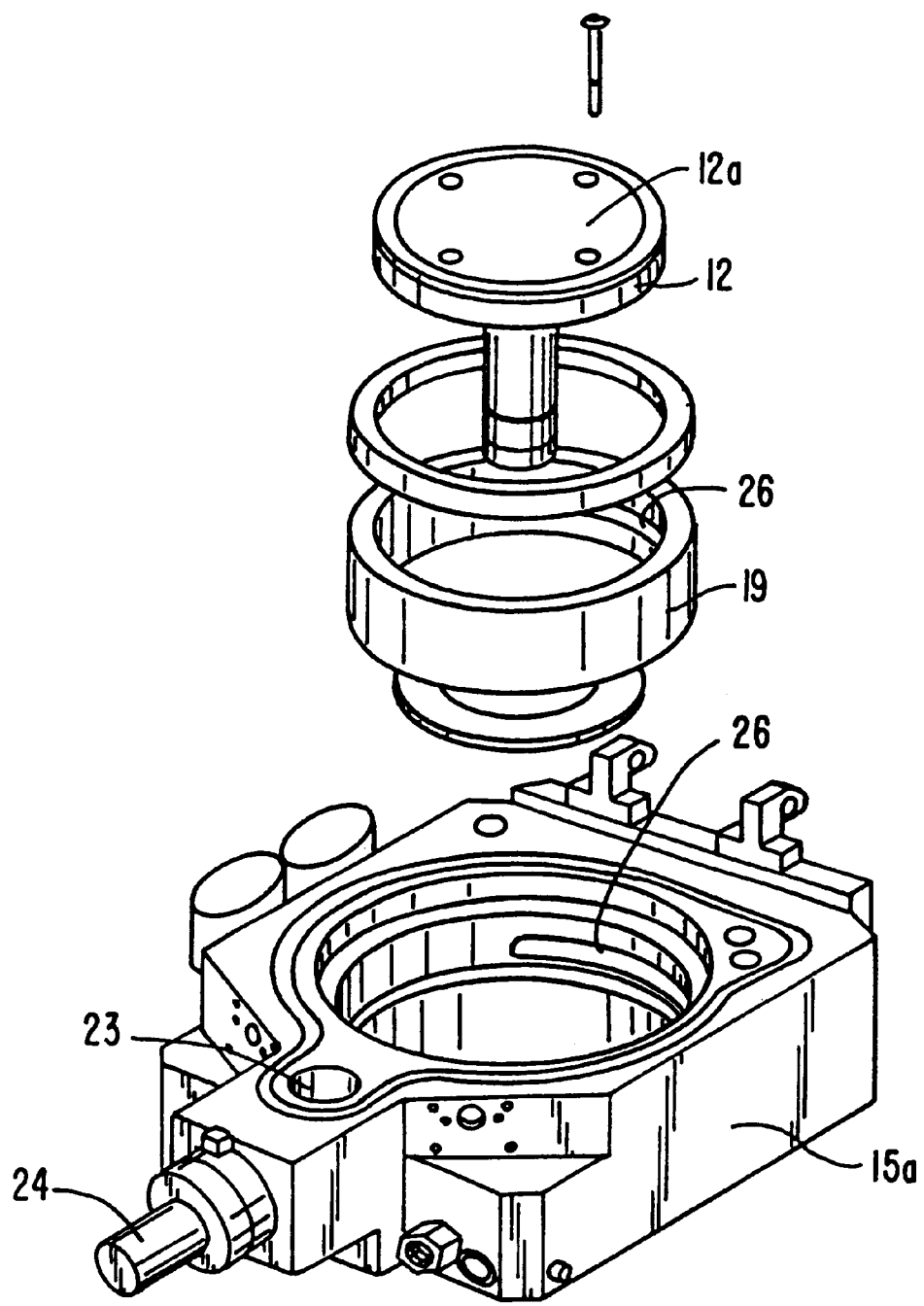
FIG. IC.

IN SITU DEPOSITION OF A DIELECTRIC OXIDE LAYER AND ANTI-REFLECTIVE COATING

CROSS-REFERENCE TO RELATED APPLICATIONS

This application is related to patent application Ser. No. 08/672,888 entitled "METHOD AND APPARATUS FOR DEPOSITING ANTIREFLECTIVE COATING," having David Cheung, Joe Feng, Judy H. Huang, and Wai-Fan Yau as inventors; Application No 16301-009310/AMAT-1084-P2 entitled "METHOD AND APPARATUS FOR DEPOSITING AN ETCH STOP LAYER," having Judy H. Huang, Wai-Fan Yau, David Cheung, and Chan-Lon Yang as inventors; and Application No 16301-016100/AMAT-1694 entitled "METHOD AND APPARATUS FOR APPLYING AN ANTIREFLECTIVE COATING USING REDUCED DEPOSITION RATES," having David Cheung, Wai-Fan Yau, Joe Feng, Judy H. Huang, and Madhu Deshpande as inventors. All of these applications are assigned to Applied Materials, Inc., the assignee of the present invention, and are hereby incorporated by reference.

BACKGROUND OF THE INVENTION

The present invention relates to an apparatus for, and the processing of, semiconductor substrates. In particular, the invention relates to the in situ deposition of dielectric layers and antireflective coatings, and the patterning of such films during substrate processing.

Since semiconductor devices were first introduced several decades ago, device geometries have decreased dramatically in size. During that time, integrated circuits have generally followed the two year/half-size rule (often called "Moore's Law"), meaning that the number of devices which will fit on a chip doubles every two years.

Today's semiconductor fabrication plants routinely produce devices with feature sizes of 0.5 microns or even 0.35 microns, and tomorrow's plants will be producing devices with even smaller feature sizes.

A common step in the fabrication of such devices is the formation of a patterned thin film on a substrate by chemical reaction of gases. When patterning the thin films, it is desirable that fluctuations in line width and other critical dimensions be minimized. Errors in these dimensions can result in variations in device characteristics or open-/short-circuited devices, thereby adversely affecting device yield. Thus, as feature sizes decrease, structures must be fabricated with greater accuracy. As a result, some manufacturers now require that variations in the dimensional accuracy of patterning operations be held to within 5% of the dimensions specified by the designer.

These films are often formed by etching away portions of a deposited blanket layer. Modern substrate processing systems employ photolithographic techniques to pattern layers. Typically, such photolithographic techniques employ photoresist or other light-sensitive material deposited on a wafer. A photomask (also known simply as a mask) having transparent and opaque regions embodying the desired pattern is positioned over the photoresist. When the mask is exposed to light, the transparent portions allow for the exposure of the photoresist in those regions, but not in the regions where the mask is opaque. The light causes a chemical reaction in exposed portions of the photoresist (e.g., photosolubilization or polymerization). A suitable chemical, chemical vapor or ion bombardment process is then used to selectively attack either the reacted or unreacted portions of the photoresist. With the remaining photoresist pattern acting as a mask, the underlying layer may then undergo further processing. For example, the layer may be doped or etched, or other processing carried out.

Modern photolithographic techniques often involve the use of equipment known as steppers, which are used to mask and expose photoresist layers. Steppers often use monochromatic (single-wavelength) light, enabling them to produce the detailed patterns required in the fabrication of fine geometry devices. As a substrate is processed, however, the topology of the substrate's upper surface becomes progressively less planar. This uneven topology can cause reflection and refraction of the monochromatic light, resulting in exposure of some of the photoresist beneath the opaque portions of the mask. As a result, this uneven surface topology can alter the mask pattern transferred to the photoresist layer, thereby altering the desired dimensions of the structures subsequently fabricated.

One phenomenon which may result from these reflections is known as standing waves. When a photoresist layer is deposited on a reflective underlying layer and exposed to monochromatic radiation (e.g., deep ultraviolet (UV) light), standing waves may be produced within the photoresist layer. In such a situation, the reflected light interferes with the incident light and causes a periodic variation in light intensity within the photoresist layer in the vertical direction. Standing-wave effects are usually more pronounced at the deep UV wavelengths used in modern steppers than at longer wavelengths because surfaces of materials such as oxide, nitride, and polysilicon are more reflective at deep UV wavelengths. The existence of standing waves in the photoresist layer during exposure causes roughness in the vertical walls formed when sections of the photoresist layer are removed during patterning, which translates into variations in linewidths, spacing and other critical dimensions.

One technique helpful in achieving the necessary dimensional accuracy is the use of an antireflective coating (ARC). An ARC's optical characteristics are such that reflections occurring at inter-layer interfaces are minimized. The ARC's absorptive index is such that the amount of monochromatic light transmitted (in either direction) is minimized, thus attenuating both transmitted incident light and reflections thereof. The ARC's refractive and absorptive indices are fixed at values that cause any reflections which might still occur to be canceled.

Also important in achieving accurate transfer of the mask pattern is the reactivity of deposited materials with respect to the etchants used in etching a given layer.

A material's reactivity with respect to another material with regard to a given etchant is known as the material's etch selectivity. Etch selectivity is usually denoted by a ratio of the etch rate of the material to be removed to that of the other material. A high etch selectivity is therefore often desirable because, ideally, an etchant should selectively etch only the intended areas of the layer being etched and not erode other structures which may already exist on the substrate being processed. In other words, a material with high etch selectivity substantially resists unintended etching during the intended etching of another material.

For example, high etch selectivity of a first layer with respect to a second, overlying layer is desirable when different patterns are to be etched into the first and second layers. High etch selectivity is desirable in such situations because the underlying layer will not be significantly eroded in areas where the second layer is completely etched away. If the first layer's etch selectivity is low, the etching operation removes not only the intended regions of the second layer, but portions of the first layer underlying those regions as well. While a small amount of the first layer is normally removed in such situations, extremely low etch selectivity may permit substantial etching of the first layer.

For example, such high etch selectivity is desirable in a damascene process. Damascene is a jewelry fabrication term that has been adopted in the processing of substrates to refer to a metallization process in which interconnect lines are recessed in a planar dielectric layer by patterning troughs in the dielectric layer and blanketing the dielectric layer's surface with a layer of metal, thereby filling the troughs. The excess metal (i.e., that metal not filling the troughs) is then removed by chemical-mechanical polishing (CMP). This is in contrast to the traditional process used to create metal interconnect lines, which first forms metal interconnect lines over a dielectric layer and subsequently blankets the entire structure with one or more layers of dielectric material.

One advantage of a damascene process is that it eliminates the need for etching the metal layer, increasing the flexibility in the metal composition. Dry etching of aluminum-copper alloys, for example, becomes more difficult as the copper content increases. When no etching is required, more copper (or other elements) can be added to the alloy, thereby improving the metal's immunity to electromigration. The damascene wiring technique has been used with many different wiring materials, including tungsten, aluminum alloys, copper and silver. Additionally, the resulting surface is more planar than those surfaces created by traditional processes.

However, if the dielectric layer being patterned and underlying layer etch at the same rate (i.e., the underlying layer exhibits poor etch selectivity with regard to the dielectric layer), damage may be done to the underlying layer before the completion of the patterning process. This could occur, for example, where the layer underlying the dielectric layer being patterned is itself a dielectric layer of similar composition, which is often the case. Without a means for stopping the etchant's action at a point near the interface between the two layers, such a process becomes difficult to accurately control.

An extension of the damascene method is the dual-damascene technique. Using a dual-damascene technique, only one planarization step is required to form both studs (i.e., vias or contacts) and interconnect lines. This process increases the density, performance, and reliability of devices thus fabricated. The process sequence begins by first defining contact openings and troughs for interconnects in two consecutive masking steps on a planar insulator surface. Contacts are then selectively and partially etched in the insulator. The masking material is then etched to a depth that removes the mask from trough regions, but leaves sufficient masking material elsewhere. Next, the masking material is removed, and the metal layer is deposited and polished (e.g., by a planarization technique such as CMP). This polishing causes the metal's upper surface to become level with the insulator's surface.

By forming studs and interconnects with the same material, the number of interfaces between dissimilar materials is reduced, increasing the reliability of the metallization system. Again, however, low etch selectivity of the underlying dielectric can pose a problem. Also problematic is the number of masking/etching steps required to create such structures. The dielectric layer must be deposited, and then masked and etched several times.

It is therefore desirable to provide a structure which avoids unwanted etching of layers underlying the layer being patterned. It is also desirable to create such a layer using a minimal number of processing steps. Additionally, the photolithography process would benefit from a technique by which such patterning might be done more accurately, such as by the use of an ARC layer. Specifically, such a layer should allow the use of a damascene process, whereby metal interconnect may be deposited accurately and in a preferable composition. Finally, such a process should allow accurate control over the transition between the layers so deposited and should not require intervening processing steps, such as cleaning steps and the like.

SUMMARY OF THE INVENTION

The present invention solves the above problems of the prior art by providing a method and apparatus for depositing a dielectric layer and an ARC without the need for removing the substrate being processed from the processing chamber and without the need for intervening processing steps such as chamber cleaning operations. This process is thus referred to herein as an in situ process. Moreover, the ARC of the present invention may be used as an etch stop layer (e.g., in a damascene process) to protect the associated dielectric layer during the patterning of layers above the ARC.

According to the method of the present invention, a process is described for the deposition of a multi-layer film on a substrate disposed in a processing chamber. The process begins by depositing a first layer over the substrate. Next, process gases including a silicon-containing gas, a nitrogen-containing gas and, optionally, an oxygen-containing gas are introduced into the processing chamber. Energy is then applied to the process gases to deposit a second layer over the first layer. The application of energy to the process gases is maintained for a period of time. This period of time is sufficient in length to deposit the second layer to a thickness which enables the second layer to reduce reflection and refraction of incident radiant energy within a third layer. The third layer will normally be a layer of photoresist material formed over the second layer, with the incident radiant energy thus causing a reaction in the third layer. Throughout this process, the substrate remains in the processing chamber. Eliminating the need to remove the substrate from the processing chamber between depositing the first and second layers, for chamber cleanings and the like, improves throughput, reduces downtime and reduces contamination, among other benefits. Moreover, this in situ process allows accurate control over the rate of transition between the first and second layers.

In another aspect of the present invention, a substrate processing system is described which includes several components. Among these components are: a housing forming a chamber; a substrate transport system coupled to the chamber; an energy application system coupled to the chamber; a gas distribution system coupled to the chamber; a controller for controlling the gas distribution system, the substrate transport system, and the energy application system; and a memory coupled to the controller comprising a computer readable medium having a computer readable program embodied therein for directing operation of the substrate processing system to deposit a multi-layer film over a substrate disposed in the chamber.

The computer readable program causes the processing system to create the multi-layer film of the present invention by first controlling the substrate transport system to position the substrate in the chamber and controlling the gas distribution system to introduce a first process gas comprising silicon and a second process gas comprising oxygen into the chamber. Next, the program causes the energy application system to apply energy to the first and the second process gases to deposit a first layer over the substrate. A third process gas comprising nitrogen is then introduced into the chamber by the gas distribution system. The program then causes the energy application system to apply energy to the first and the third process gases to deposit a second layer over the first layer. The application of energy is maintained for a period of time sufficient in length to deposit the second layer to a specified thickness. Finally, the substrate transport system removes the substrate from the chamber.

The substrate thus remains in the chamber throughout the execution of the program. The specified thickness enables the second layer to reduce reflection and refraction of incident radiant energy within a third layer. The third layer, sensitive to the incident radiant energy, is formed over the second layer. A pattern is projected onto the third layer using the incident radiant energy to create a patterned layer. The incident radiant energy causes a reaction in the third layer, such as the photosolubilization/polymerization reactions which occur in certain photoresists. The pattern is subsequently transferred from the patterned layer to the second layer.

A further understanding of the nature and advantages of the present invention may be realized by reference to the remaining portions of the specification and the drawings.

BRIEF DESCRIPTION OF THE DRAWINGS

FIGS. 1C and 1D are exploded perspective view of parts of the CVD chamber depicted in FIG. 1A;

DESCRIPTION OF THE SPECIFIC EMBODIMENTS

I. Introduction

In a preferred embodiment of the present invention, a dielectric antireflective coating (DARC) containing silicon, oxygen and nitrogen is deposited in situ over a dielectric layer, containing silicon, oxygen and, optionally, a halogen dopant. These layers are deposited without having to remove the substrate from the processing chamber in which it is situated, reducing the number of processing steps required to deposit such a structure and providing more accurate transfer of an original mask pattern. Moreover, the DARC in this structure may serve as an etch stop layer in the patterning of subsequently-applied layers, allowing the use of substrate processing methods such as the dual damascene technique.

According to the present invention, a dielectric/DARC structure may be deposited on a substrate using a plasma-enhanced chemical vapor deposition (PECVD) technique. This technique may be used to deposit a dielectric/DARC structure by promoting each of the two chemical reactions substantially adjacent to the substrate's surface. To deposit the dielectric layer, a chemical reaction is preferably promoted between silane ($SiH_4$), nitrous oxide ($N_2O$) and silicon tetrafluoride ($SiF_4$). To deposit the DARC, a chemical reaction is promoted between silane and nitrous oxide, in the presence of a dilutant gas such as helium (He). Helium may also be used in the deposition of the dielectric layer. Additionally, one or more nitrogen containing substances (e.g., ammonia ($NH_3$)) may be added to adjust the optical properties of the resulting DARC.

While these process gases are preferred, they are by no means the only combination which may be used in the present invention. For example, other silicon-containing compounds, such as tetraethoxysilane (TEOS) and others, other oxygen sources such as oxygen ($O_2$), ozone ($O_3$) and others, and other nitrogen sources, may also be employed, although different processing conditions may be required.

II. An Exemplary CVD System

Figure 1A:
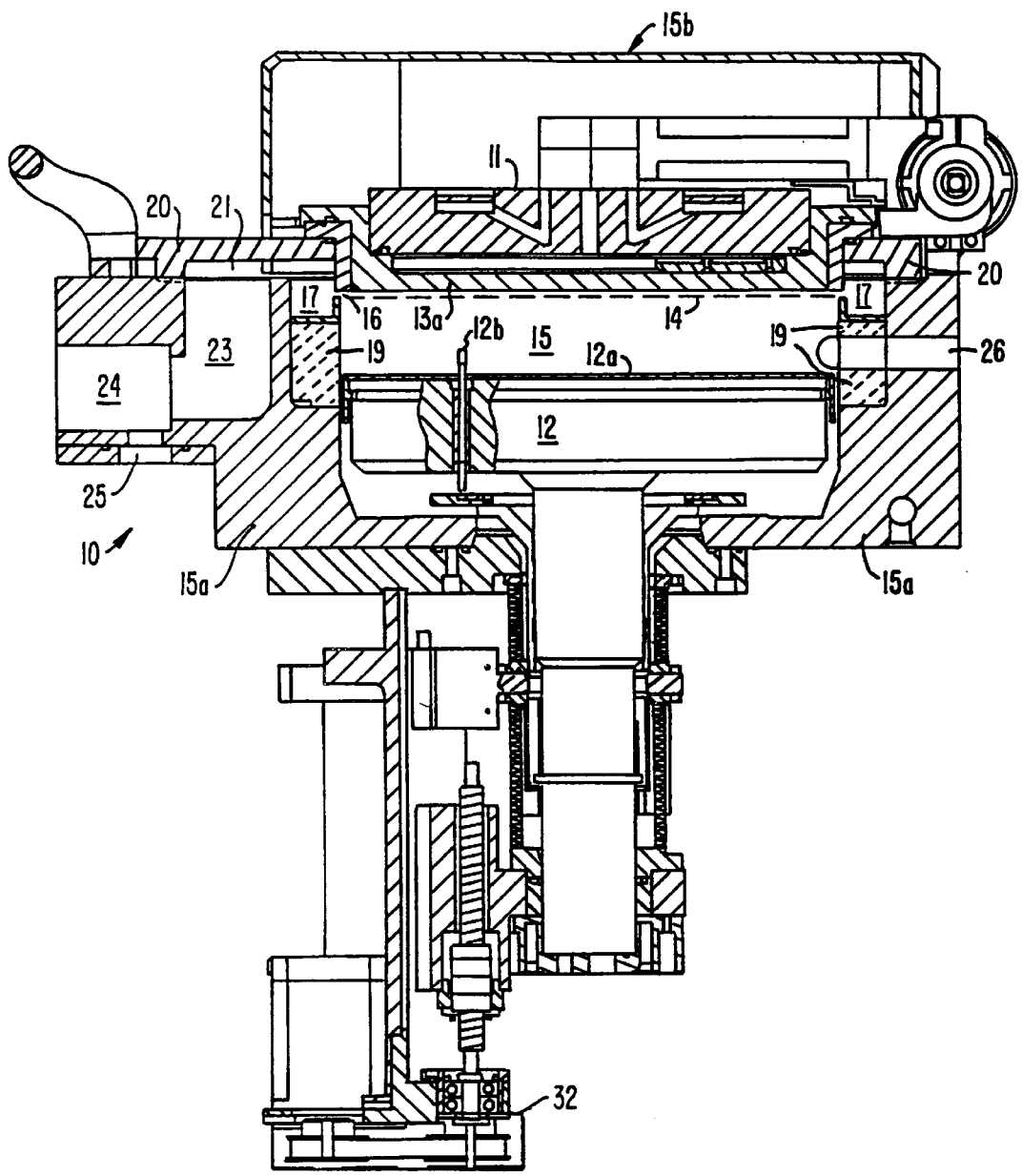
FIGS. 1A and 1B are vertical, cross-sectional view of one embodiment of a chemical vapor deposition apparatus according to the present invention.
Figure 1B:
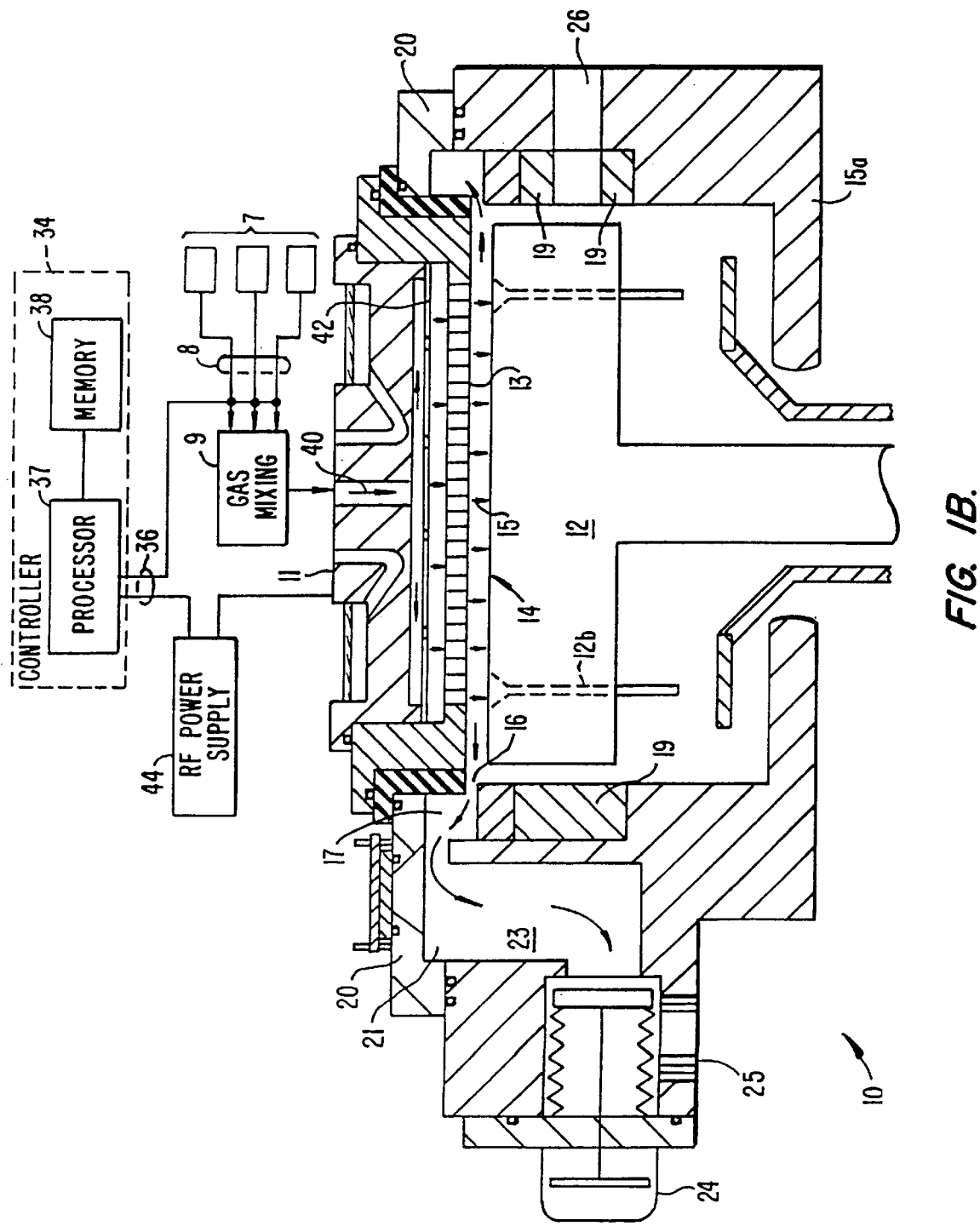
Figure 1D:
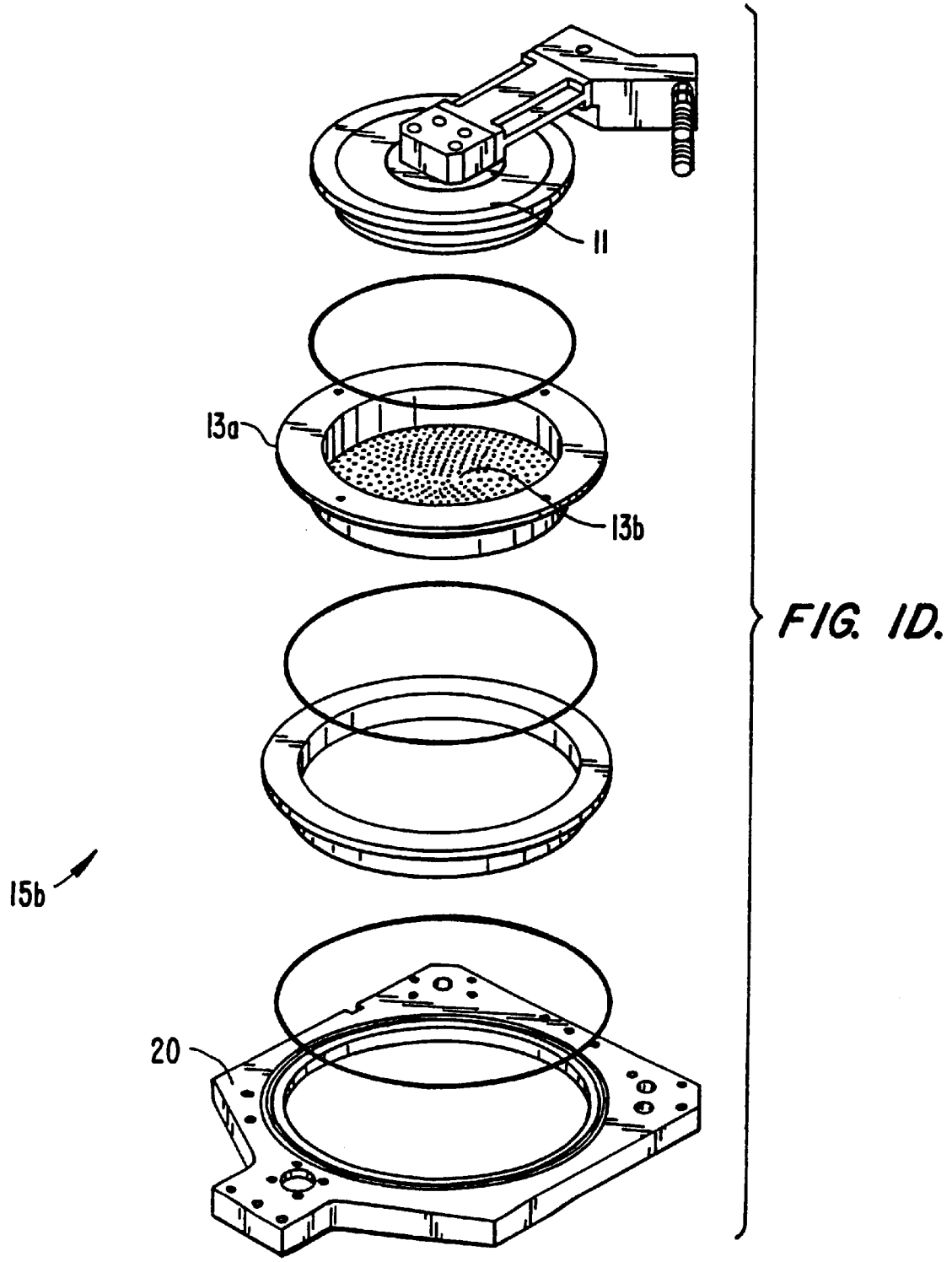

One CVD system suitable for practicing the method of the present invention is shown in FIGS. 1A and 1B, which are vertical, cross-sectional views of a chemical vapor deposition system 10, having a vacuum or processing chamber 15 that includes a chamber wall 15a and chamber lid assembly 15b. Chamber wall 15a and chamber lid assembly 15b are shown in exploded perspective views in FIGS. 1C and 1D.

Reactor 10 contains a gas distribution manifold 11 for dispersing process gases to a substrate (not shown) that rests on a heated pedestal 12 centered within the process chamber. During processing, the substrate (e.g., a semiconductor wafer) is positioned on a flat (or slightly convex) surface 12a of pedestal 12. The pedestal can be controllably moved between a lower loading/off-loading position (depicted in FIG. 1A) and an upper processing position (indicated by dashed line 14 in FIG. 1A and shown in FIG. 1B) which is closely adjacent to manifold 11. A centerboard (not shown) includes sensors for providing information on the position of the substrates.

Deposition and carrier gases are introduced into chamber 15 through perforated holes 13b (FIG. 10) of a conventional flat, circular gas distribution face plate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a. Before reaching the manifold, deposition and carrier gases are input from gas sources 7 through gas supply lines 8 into a mixing system 9 where they are combined and then sent to manifold 11. Generally, the supply line for each process gas includes (I) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma enhanced process. In a plasma enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the substrate supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15.

During a deposition process, the plasma heats the entire process chamber 10, including the walls of the chamber body 15a surrounding the exhaust passageway 23 and the shutoff valve 24. When the plasma is not turned on, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants which might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the substrate so as to deposit a uniform film on the substrate.

From the exhaust plenum 17, the gases flow underneath a lateral extension portion 21 of the exhaust plenum 17, past a viewing port 22, through a downward-extending gas passage 23, past a vacuum shut off valve 24 (whose body is integrated with the lower chamber wall 15a), and into the exhaust outlet 25 which connects to the external vacuum pump (not shown) through a foreline (also not shown).

The substrate support platter of the pedestal 12 (preferably aluminum) is heated using a double full-turn single-loop embedded heater element configured to form parallel concentric circles. An outer portion of the heater element runs adjacent to a perimeter of the support platter while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum or anodized aluminum. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 32 raises and lowers the heater pedestal assembly 12 and its substrate lift pins 12b as substrates are transferred into and out of the body of the chamber by a robot blade (not shown) through an insertion/removal opening 26 in the side of the chamber 10. The motor 32 raises and lowers pedestal 12 between a processing position 14 and a lower, substrate-loading position. The motor, valves or flow controllers connected to the supply lines 8, gas delivery system, throttle valve, RF power supply 44, and chamber and substrate heating systems are all controlled by a system controller 34 over control lines 36, of which only some are shown. Controller 34 relies on feedback from optical sensors to determine the position of moveable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure having a 16-bit data bus and 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 1E:
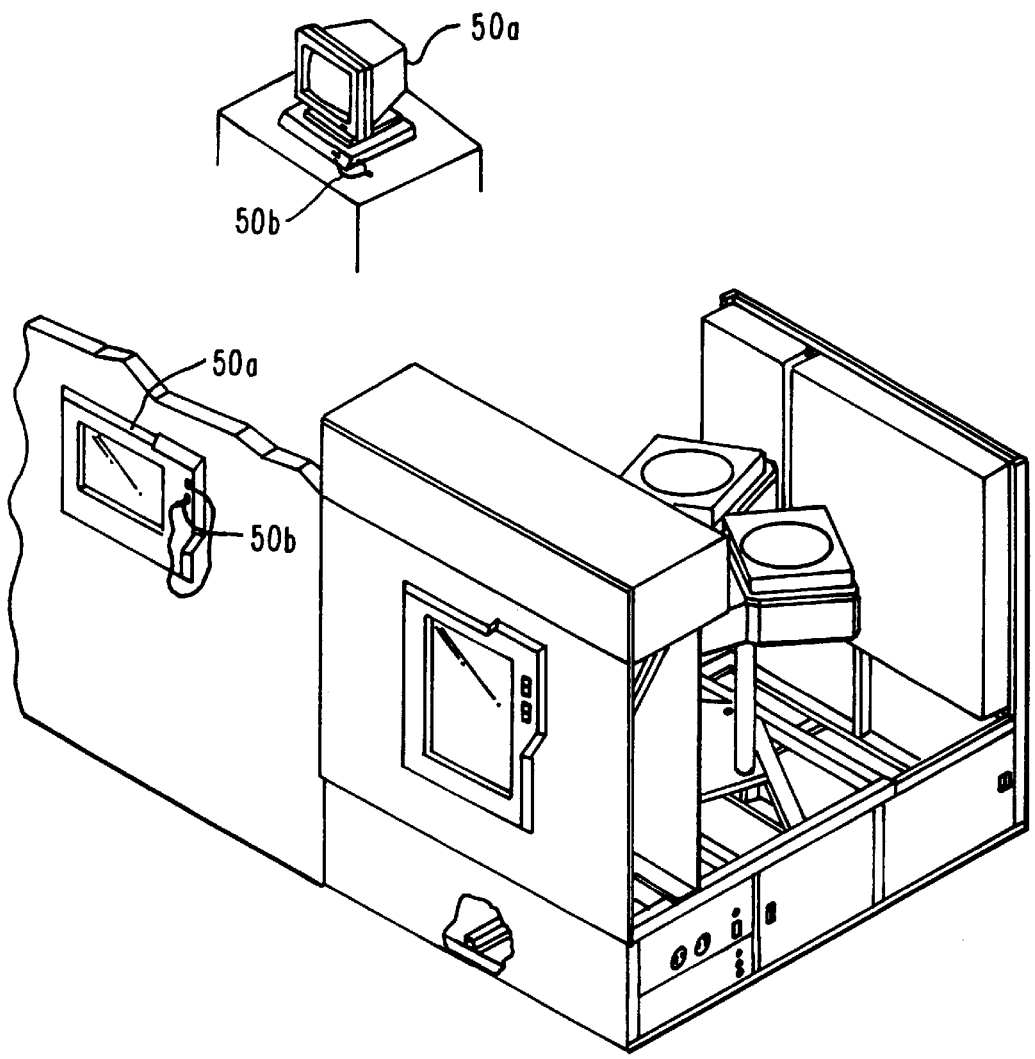
FIG. 1E is a simplified diagram of system monitor and CVD system 10 in a multichamber system.

The interface between a user and controller 34 is via a CRT monitor 50a and light pen 50b, shown in FIG. 1E, which is a simplified diagram of the system monitor and CVD system 10 in a substrate processing system which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked compiled object code the system user invokes the object code, causing the computer system to load the code in memory. The CPU then reads and executes the code to perform the tasks identified in the program.

Figure 1F:
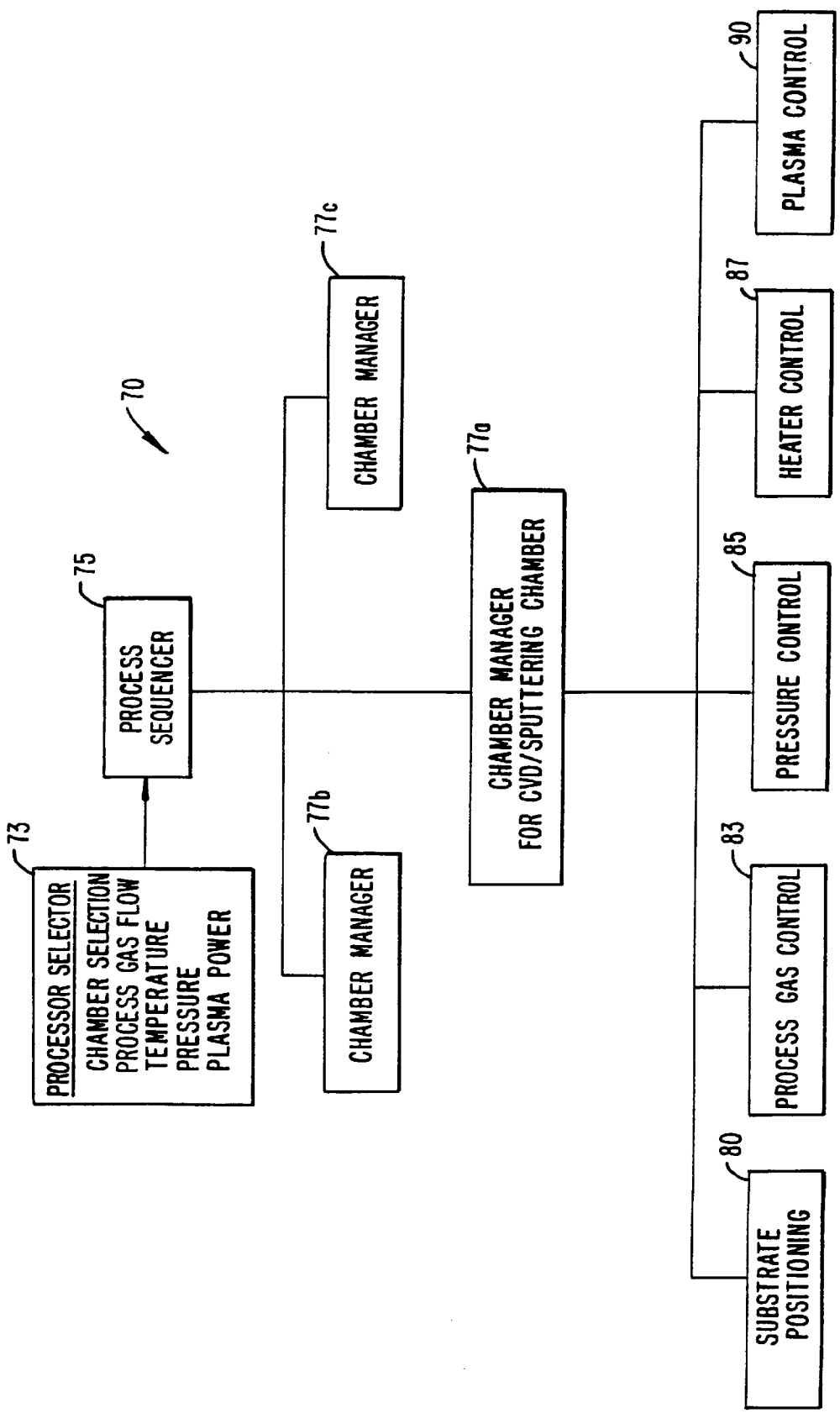
FIG. 1F shows an illustrative block diagram of the hierarchical control structure of the system control software, computer program 70, according to a specific embodiment.

FIG. 1F shows an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (I) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature and are provided to the user in the form of a recipe. The parameters specified by the process recipe are entered utilizing the light pen/CRT monitor interface. The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the equencer subroutine 75 includes a program code to perform the steps of (I) monitoring he operation of the process chambers to determine if the chambers are being used, (ii) etermining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto the susceptor 12 and, optionally, to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (I) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 is written to include steps for bubbling a delivery gas, such as helium, through the liquid precursor in a bubbler assembly or introducing a carrier gas, such as helium, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system 115. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure nanometers connected to the chamber, comparing the measured value(s) to the target pressure, obtaining PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, comparing the measured temperature to the setpoint temperature, and increasing or decreasing current applied to the heating unit to obtain the setpoint temperature. The temperature is obtained from the measured voltage by looking up the corresponding temperature in a stored conversion table, or by calculating the temperature using a fourth order polynomial. When an embedded loop is used to heat the susceptor 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in susceptor design, heater design, RF power frequencies, location of RF power connections and others are possible. For example, the substrate could be supported and heated by quartz lamps, as is done in the Centura 5000 DLH chamber manufactured by Applied Materials, Inc., of Santa Clara, CA. The layer and method for forming such a layer of the present invention is not limited to any specific apparatus or to any specific plasma excitation method.

III. Deposition of a Dielectric/DARC Structure

Figure 2:
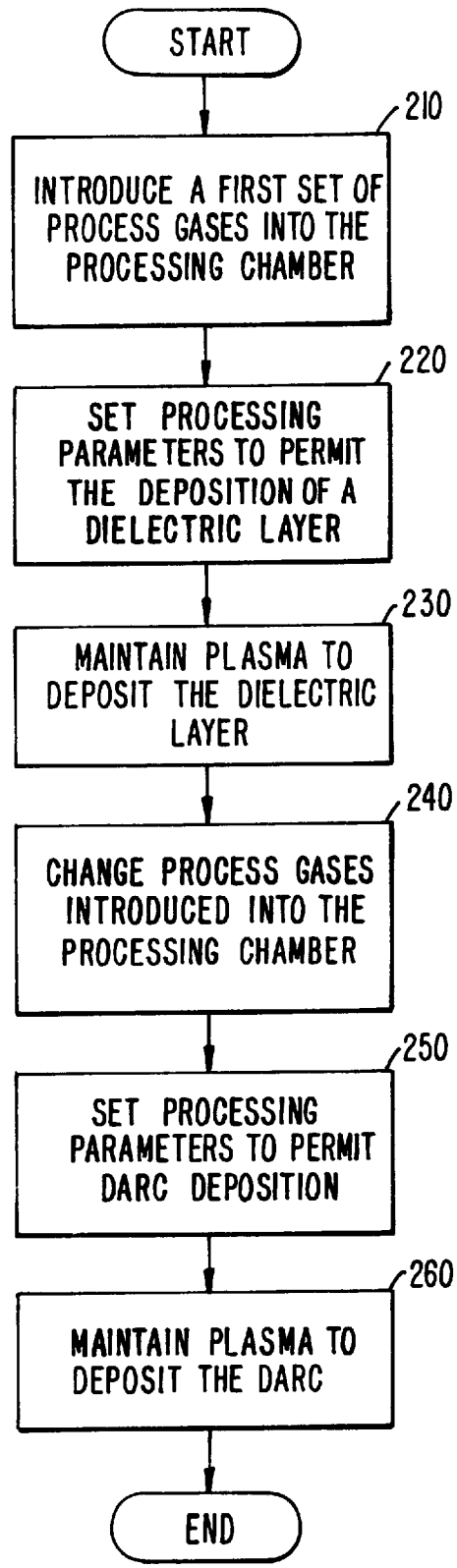
FIG. 2 is a flow diagram for a process of depositing a dielectric layer and ARC according to the method of the present invention.

FIG. 2 is a flow diagram illustrating the steps performed in depositing a dielectric/DARC structure according to one embodiment of the present invention. The flow diagram is described in terms of the exemplary PECVD system shown in FIG. 1A. The process begins by depositing a dielectric layer over the upper surface of a substrate positioned in vacuum chamber 15. At step 210, the process gases used to deposit the dielectric layer are introduced into vacuum chamber 15. These process gases preferably include silane, nitrous oxide and silicon tetrafluoride. Silane is preferably introduced into vacuum chamber 15 at a rate of between about 10 sccm and 400 sccm. Nitrous oxide is preferably introduced into vacuum chamber 15 at a rate of between about 100 sccm and 3000 sccm. Silicon tetrafluoride is preferably introduced into vacuum chamber 15 at a rate of between about 10 sccm and 700 sccm.

Environmental parameters within the chamber are then set to the proper levels at step 220. Pressure in vacuum chamber 15 is maintained at between about 2 torr and 10 torr as the process gases are introduced. Substrate temperature is maintained at between about 200° C. and 400° C. The spacing between pedestal 12 and face plate 13a is in the range of 200–650 mils. RF power supply 44, which supplies RF energy to manifold 11 (and thus to face plate 13a), is switched on at step 220 to form a controlled plasma from the process gases adjacent to the substrate. Preferably, RF power supply 44 provides between about 50 Watts and 1200 Watts of RF power, which translate to a plasma density of between about 0.12 W/cm$^2$ and 3.10 W/cm$^2$. The aforementioned conditions are preferably maintained throughout the deposition of the DARC. At step 230, the plasma is maintained for a period of time sufficient in length to deposit the dielectric layer to a desired thickness.

Next, a DARC according to the present invention is deposited over the dielectric layer. At step 240, the process gases used to deposit the DARC are introduced into vacuum chamber 15. These process gases preferably include silane, nitrous oxide and helium. Silane is preferably introduced into vacuum chamber 15 at a rate of between about 10 sccm and 300 sccm. Nitrous oxide is preferably introduced into vacuum chamber 15 at a rate of between about 10 sccm and 300 sccm. Helium is preferably introduced into vacuum chamber 15 at a rate of between about 100 sccm and 4000 sccm.

Processing parameters within the chamber are then set to the proper levels at step 250. The spacing between pedestal 12 and face plate 13a is in the range of 200–650 mils. Pressure in vacuum chamber 15 is maintained at between about 2 torr and 10 torr as the process gases are introduced. Substrate temperature is maintained at between about 200° C. and 400° C. RF power supply 44, which supplies RF energy to manifold 11 (and thus to face plate 13a), is switched on at step 230 to form a controlled plasma from the process gases adjacent to the substrate. Preferably, RF power supply 44 provides between about 50 Watts and 500 Watts of RF power. These RF power levels translate to a plasma density of between about 0.12 W/cm$^2$ and 1.29 W/cm$^2$. The 10 aforementioned conditions are preferably maintained throughout the deposition of the DARC. At step 260, the plasma is maintained for a period of time sufficient in length to deposit the DARC to a thickness of between about 100 Å and 2000 Å.

The transition between the two layers is controlled by the transition between the chemistries used to deposit the layers and their related process parameters. The method of the present invention allows accurate control over this transition via the control over the plasma, the process gas flow rates, and other processing parameters. Preferably, the transition between the two layers is abrupt. This can be achieved, for example, by extinguishing the plasma between the deposition of the dielectric layer and the DARC. The substrate being processed is not removed from the processing chamber, however. Gradual transitions can be also be achieved. For example, this may be done by altering the flow rates of the process gases. In a process which deposits a fluorosilicate glass (FSG) dielectric and a silicon oxynitride DARC, such as that described previously, the flow rate of silicon tetrafluoride may be reduced while increasing the helium flow rate to transition from the dielectric layer to the DARC. This creates a smooth transition between the dielectric layer and the DARC. This flexibility is made possible by the in situ nature of the method of the present invention.

The process parameters and gas introduction rates described herein are representative values for a resistively-heated Centura DxZ Chamber manufactured by Applied Materials, Inc., outfitted to process 8-inch substrates. This process is not intended to limit the method of the present invention. Other chamber sizes or chambers made by other manufacturers may have different values. As previously noted, other reactants (e.g., TEOS) and process parameters (e.g., decreasing helium flow and increasing nitrogen flow) may be used to deposit a dielectric/DARC structure of the type described herein. For example, a combination of TEOS and oxygen may be employed to deposit the dielectric layer (specifically, a layer of silicon oxide), which may be doped with a halogen element such as fluorine to improve the layer's physical and electrical characteristics.

The in situ process of the present invention provides several benefits. Depending on the process employed, only process gases and environmental parameters may need to be changed in between the depositions using this method because of the chemistries used in the deposition of the dielectric layer and the DARC. There is no need to remove the substrate between depositions or to perform intervening steps such as cleaning operations when such processes are employed. This promotes a more stable process, improving yield. The use of fewer process steps translates into reduced equipment wear and reduced consumables costs.

The in situ nature of this process also leads to increases in throughput when compared to a conventional process (which deposits the two layers separately, with intervening steps such as cleanings and the like). For example, when simply depositing a dielectric/DARC structure, the method of the present invention may be used to process about 67 substrates in the time a conventional process takes to fabricate such a structure on 40 substrates. When a complete dual damascene structure is fabricated, the disparity is even greater, with the method of the present invention processing about 94 substrates to the 40 substrates processed using a conventional technique.

IV. An Exemplary Dielectric/DARC Structure

Figure 3:
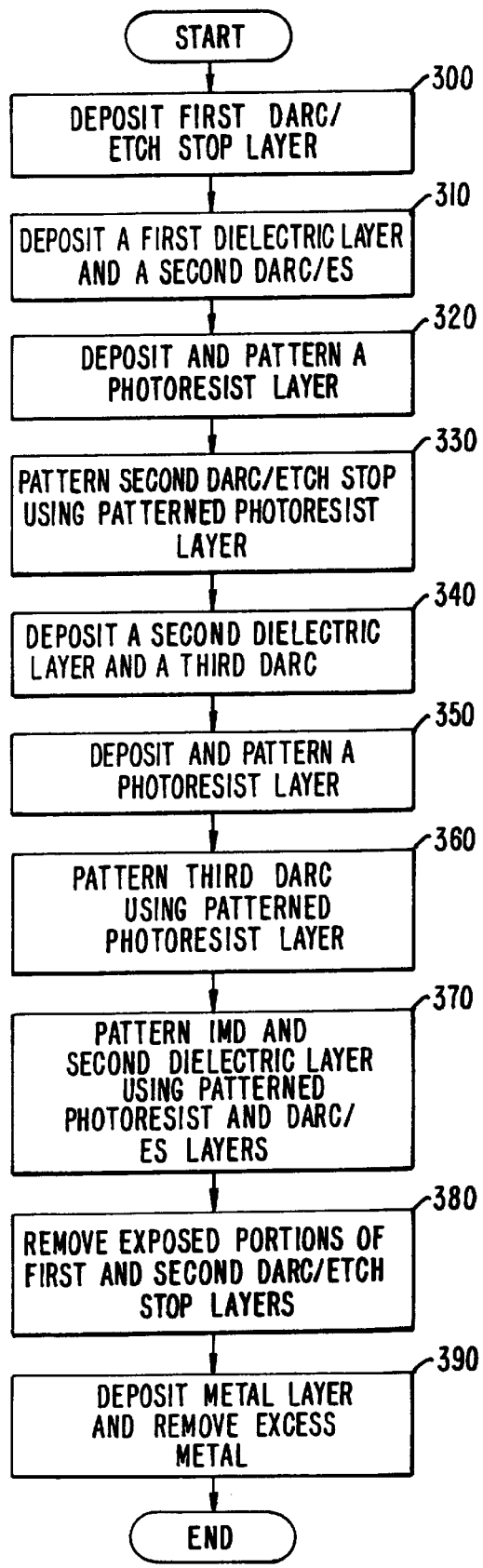
FIG. 3 is a flow diagram for an exemplary process of depositing a dual damascene structure using dielectric layer/ARC structures fabricated according to the method of the present invention.

FIG. 3 illustrates the steps performed in a dual damascene process, and is described with reference to the vertical, cross-sectional views of the structure during various points in the fabrication process shown in FIGS. 4A–4E. Using a dual-damascene technique, only one planarization step is required to form both studs (i.e., vias or contacts) and interconnect lines, increasing the density, performance and reliability of devices thus fabricated. The dual damascene structure described in this section may be fabricated over various types of structures, such as a metal interconnect layer (in which case the studs formed are referred to as vias) or doped regions known as tubs (in which case the studs formed are referred to as contacts). This technique makes use of the ability to use a DARC as an etch stop to facilitate the complete removal of dielectric material. This type of layer is referred to herein as a DARC/etch stop (DARC/ES) layer.

Figure 4A:
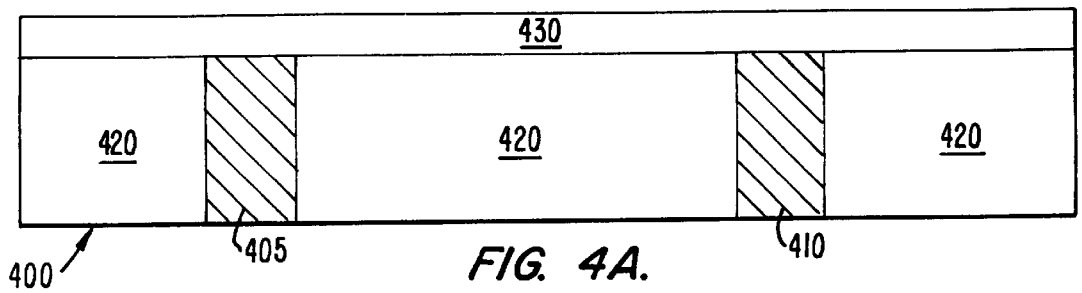
FIGS. 4A through 4E show simplified cross-sectional views of a structure fabricated according to the process of FIG. 3, at various points in the fabrication process.

In this example, the dual damascene structure is fabricated over a metal interconnect layer 400 (exemplified by metal lines 405 and 410 embedded in a first dielectric layer 420), as shown in FIG. 4A. The dual damascene process begins by depositing a DARC/ES layer 430 at step 300 using an appropriate deposition method, such as the PECVD process previously described. This is shown in FIG. 4A, where first DARC/ES layer 430 is shown deposited over metal interconnect layer 400.

Figure 4B:
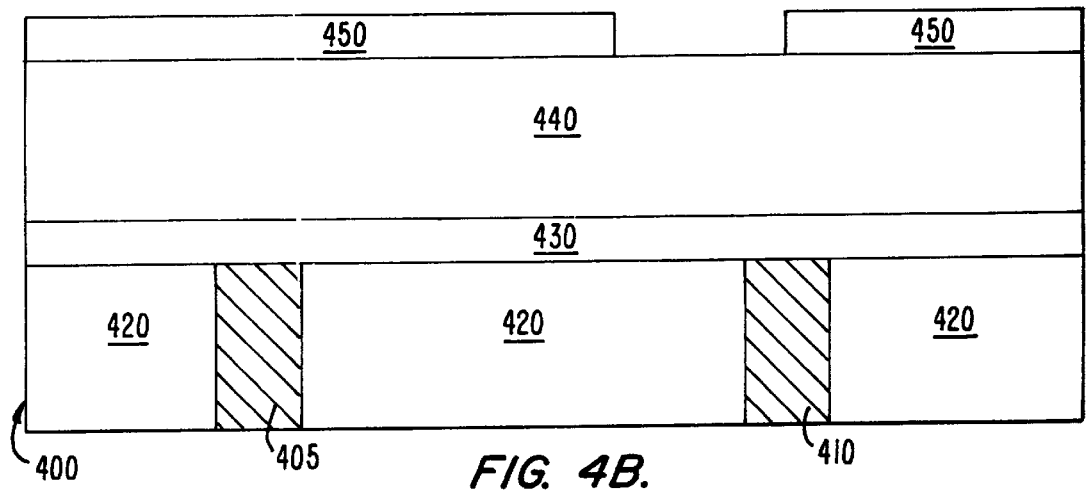

At step 310, the next portion of the darnascene structure is deposited using the in situ process of the present invention. First, a dielectric layer is deposited over the previously-deposited DARC/ES layer. This is shown in FIG. 4B as an intermetal dielectric (IMD) 440 deposited over first DARC/ES layer 430. As part of the in situ process, a DARC/ES layer is then deposited. This is shown in FIG. 4B as a second DARC/ES layer 450 deposited over IMD 440. Using the method of the present invention, these layers are deposited without any intervening steps and thus provide the process' aforementioned benefits.

The deposition of second DARC/ES layer 450 is followed by the application and patterning of photoresist material to form a patterned photoresist layer (not shown) at step 320. The pattern etched into this photoresist layer is then transferred to second DARC/ES layer 450 by an etching operation (step 330). This etching operation employs an etchant particularly suited to etching only DARC/ES material (e.g., silicon nitride or silicon oxynitride), thus avoiding any unwanted etching of IMD 440. The photoresist layer is subsequently removed. Second DARCIES layer 450 is shown in FIG. 4B after the patterning process has been completed and the photoresist layer removed.

Aside from its use as an etch stop layer in later processing steps, second DARC/ES layer 450 also provides improved accuracy in the patterning of the photoresist layer. By reducing reflection and refraction of the incident radiant energy used to expose the photoresist layer, second DARCIES layer 450 reduces the unintentional exposure of photoresist material. Second DARC/ES layer 450 is thus capable of acting as both an antireflective coating and an etch stop layer.

Figure 4C:
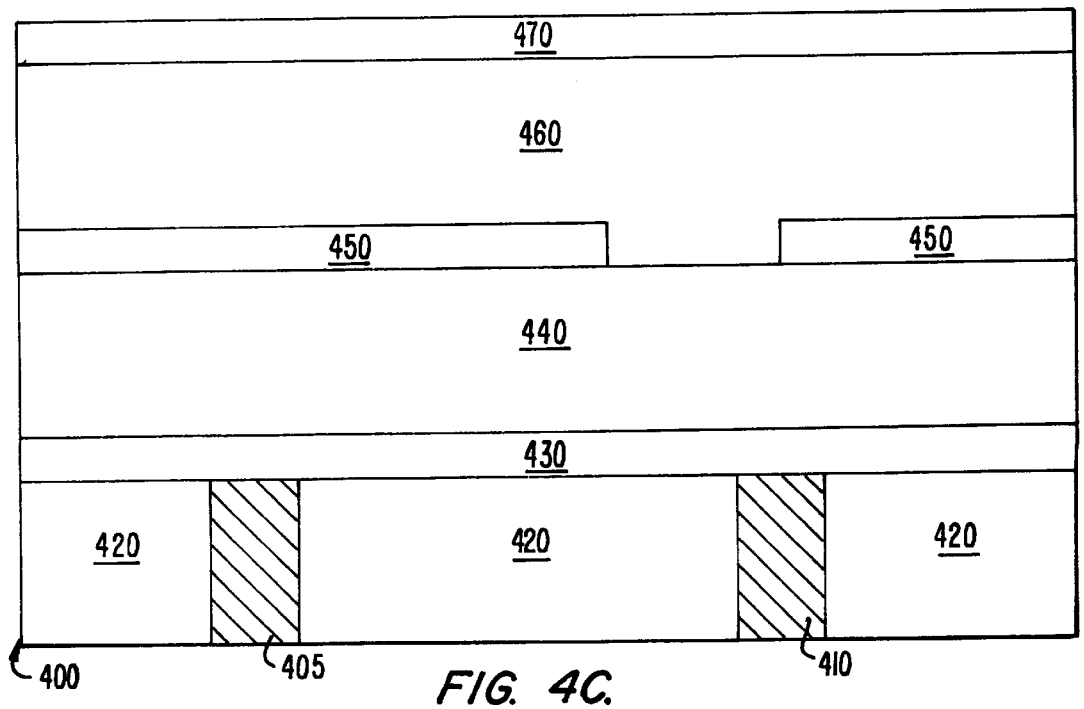

At step 340, the method of the present invention is again employed to deposit a second dielectric layer/DARC structure. As shown in FIG. 4C, a second dielectric layer 460 is deposited over second DARC/ES layer 450. According to the method of the present invention, a DARC/ES layer is then deposited. This is shown in FIG. 4C as a third DARC/ES layer 470. Again, the in situ process provides the aforementioned benefits. Third DARC/ES layer 470 may also be used as an etch stop in subsequent processing and improves accuracy in the patterning of the photoresist layer used to pattern IMD 440, in a fashion similar to second DARC/ES layer 450.

Next, a layer of photoresist material is applied and patterned using a mask pattern to form a patterned photoresist layer (not shown) at step 350. The pattern is transferred to third DARC/ES layer 470 by an etching operation (step 360). This etching operation again employs an etchant particularly suited to etching DARC/ES material (e.g., silicon nitride or silicon oxynitride). The photoresist layer is then removed.

Figure 4D:
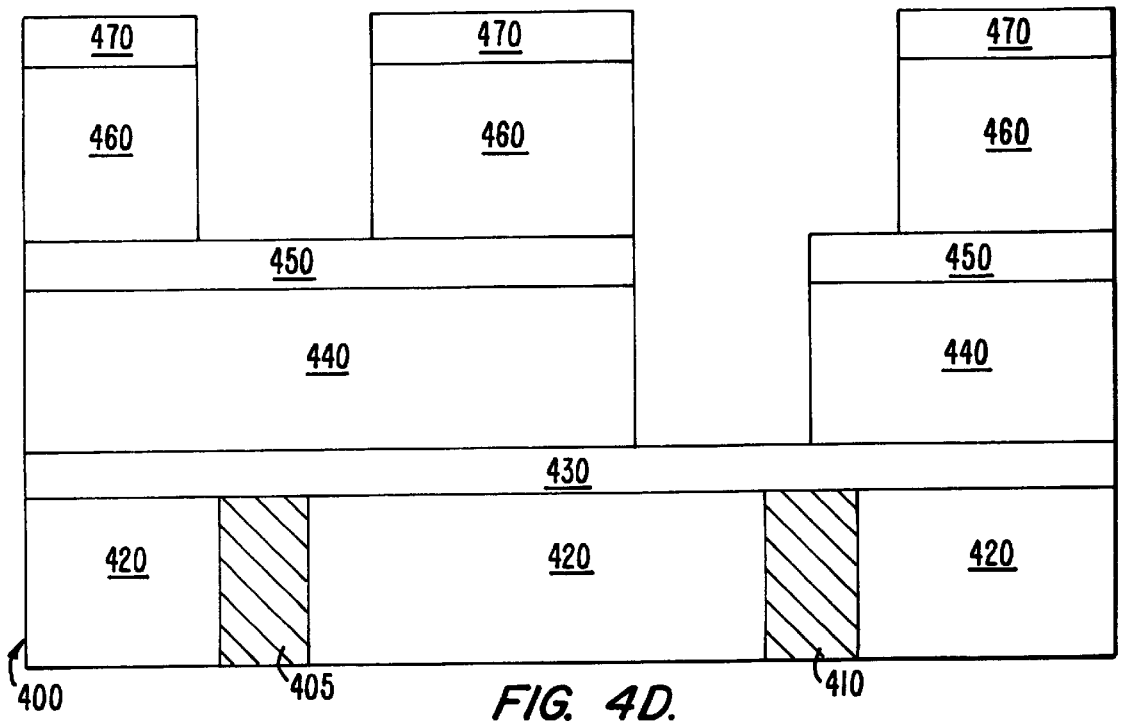
Figure 4E:
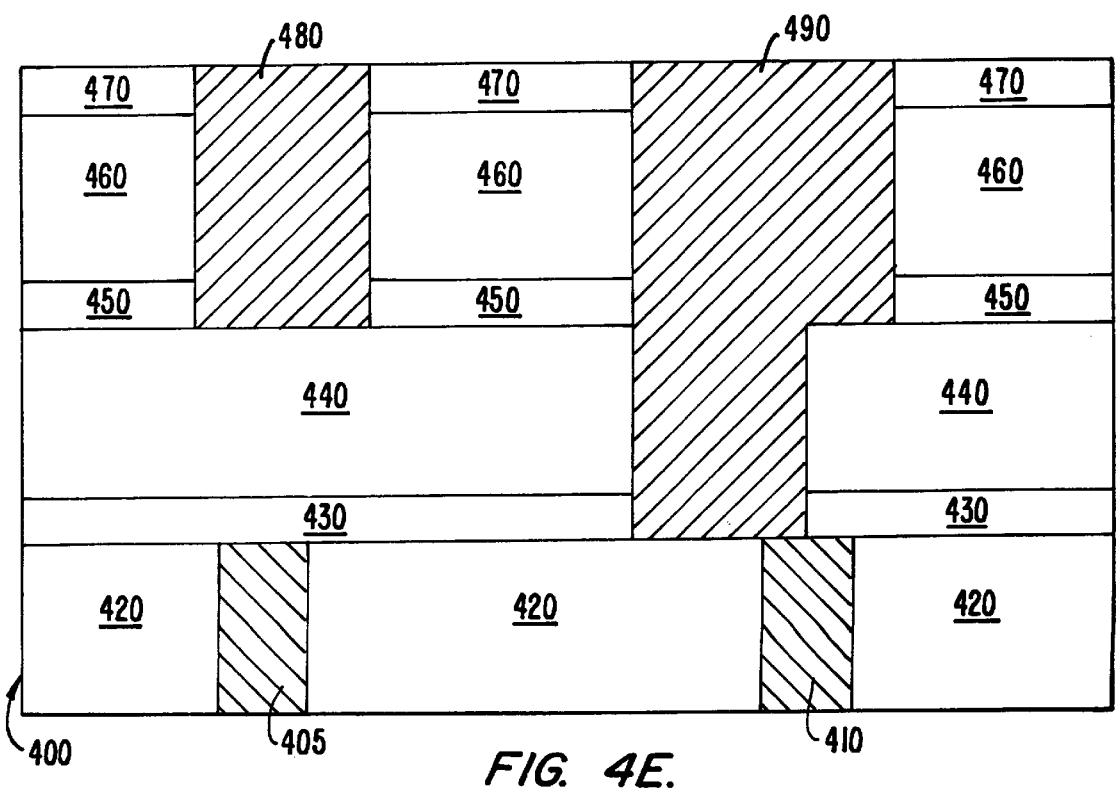

At step 370, second dielectric layer 460 and IMD 440 are patterned by an etching operation which uses first DARC/ES layer 430 as a masking layer. Second DARC/ES layer 450 and third DARC/ES layer 470 serve as etch stop layers in this step. The result of this operation can be seen in FIG. 4D, which also illustrates the results of patterning third DARC/ES layer 470. FIG. 4D shows second dielectric layer 460 and IMD 440 after etching, and illustrates the protection afforded by the DARC/ES layers. The etching operation employs an etchant particularly suited to etching a dielectric material. However, the etchant is chosen such that it has little effect on the DARC/ES layers. For example, first DARC/ES layer 430 provides substantial protection to metal interconnect layer 400, and first dielectric layer 420 in particular. This is important because first dielectric layer 420 is as susceptible to these etchants as any of the overlying dielectric layers.

Next, the exposed portions of the DARC/ES layers are removed using an etchant particularly suited to etching DARC/ES material. A metal layer (exemplified by metal lines 480 and 490) is then deposited and polished (e.g., by a planarization technique such as CMP) at step 390. This polishing removes excess metal, causing the metal's upper surface to become level with the upper surface of third DARC/ES layer 470, as is apparent in FIG. 4E. Alternatively, planarization may continue until third DARC/ES layer 470 is partially removed.

The dual damascene process described herein is made possible by its dual-chemistry nature. The etchant employed differs depending on whether dielectric or DARC/ES material is being removed. For example, the etchants used to remove the dielectric material have minimal effects on DARC/ES material. Conversely, the etchants used to remove the DARC/ES material have minimal effects on dielectric material. This allows operations such as patterning second DARC/ES layer 450 without etching IMD 440, and etching second dielectric layer 460 and IMD 440 in one operation while maintaining the profile defined by the DARC/ES layers. However, the process described herein is merely exemplary of the many uses of the method and apparatus of the present invention.

The method of the present invention is not intended to be limited by the specific parameters set forth in the above experiments. A person of ordinary skill in the art will realize that different processing conditions and different reactant sources can be used without departing from the spirit of the invention. Other equivalent or alternative methods of depositing a dielectric/DARC structure according to the present invention will be apparent to those skilled in the art. For example, although helium is used to deposit a DARC/ES layer in a preferred embodiment, other dilutant gases may also be employed, as may other sources of silicon and oxygen. The steps of the process may be reordered to deposit a DARC followed by a dielectric layer, or multiple dielectric layer/DARC pairs might be deposited in situ. These equivalents and alternatives are intended to be included within the scope of the present invention.

What is claimed is:

1. A process for the deposition of a multi-layer film on a substrate disposed in a processing chamber, said process comprising the steps of:
   depositing a first layer over the substrate;
   introducing a first set of process gases comprising a silicon-containing gas, an oxygen-containing gas and a nitrogen-containing gas into the processing chamber;
   applying energy to said first set of process gases to produce reaction of said first set of process gases to deposit a second layer over said first layer;
   maintaining said energy applied to said process gases for a period of time so as to deposit said second layer to a thickness which reduces reflection and refraction of incident radiant energy within a third layer, said third layer being formed over said second layer and said incident radiant energy causing a reaction in said third layer; and
   keeping the substrate in the processing chamber throughout said process.

2. The process of claim 1, wherein said nitrogen-containing gas provides said second layer with a high etch selectivity with respect to said first layer, thereby protecting said first layer from etching by an etchant used to etch a fourth layer deposited over said second layer.

3. The process of claim 1, wherein said period of time is of such a duration that said thickness ranges from about 100 Å to about 2000 Å, thereby protecting said first layer from etching by an etchant used to etch a fourth layer deposited over said second layer.

4. The process of claim 1, wherein said step of depositing said first layer over the substrate comprises the steps of:
   introducing a second set of process gases comprising a TEOS vapor and an oxygen-containing gas into the processing chamber; and
   applying energy to said second set of process gases to produce reaction of said second set of process gases to deposit said first layer over the substrate.

5. The process of claim 1, wherein said step of introducing said first set of process gases further comprises:
   introducing a dilutant gas into the processing chamber.

6. The process of claim 5, wherein said dilutant gas is introduced at a first rate which maintains a pressure ranging from about 2 torr to about 10 torr in the processing chamber, said maintenance of said pressure allowing said first rate to be set at a level which causes said second layer to be deposited at a deposition rate of less than 2000 Å/minute.

7. A process for the deposition of a multi-layer film on a substrate disposed in a processing chamber, said process comprising the steps of:
   introducing a first process gas comprising silicon into the processing chamber;
   introducing a second process gas comprising oxygen into the processing chamber;
   applying energy to said first and said second process gases to produce reaction of said first and said second process gases to deposit a first layer over the substrate;
   introducing a third process gas comprising nitrogen into the processing chamber;
   applying energy to said first and said third process gases to produce reaction of said first and said third process gases to deposit a second layer over said first layer;
   maintaining said energy applied to said first and said third process gases for a period of time so as to deposit said second layer to a thickness which reduces reflection and refraction of incident radiant energy within a third layer, said third layer being formed over said second layer and said incident radiant energy causing a reaction in said third layer; and
   keeping the substrate in the processing chamber throughout said process.

8. The process of claim 7, further comprising the step of stopping said said introduction of said second process gas prior to said step of introducing said third process gas.

9. The process of claim 7, wherein said third process gas provides said second layer with a high etch selectivity with respect to said first layer, thereby protecting said first layer from etching by an etchant used to etch a fourth layer deposited over said second layer.

10. The process of claim 7, wherein said period of time is of such a duration that said thickness ranges from about 100 Å to about 2000 Å, thereby protecting said first layer from etching by an etchant used to etch a fourth layer deposited over said second layer.

11. The process of claim 7, wherein said step of introducing a third process gas further comprises:
   introducing a dilutant gas into the processing chamber.

12. The process of claim 1, wherein:
   said first process gas is silane;
   said second process gas is nitrous oxide; and
   said third process gas is nitrous oxide.

13. The process of claim 11, wherein said dilutant gas is introduced at a first rate which maintains a pressure in the processing chamber ranging from about 2 torr to about 10 torr, said first rate allowing said first process gas comprising silicon to be introduced at a second rate, said second rate being such that a deposition rate of said second layer is less than about 2000 Å/minute.

14. The process of claim 13, wherein said dilutant gas is helium and said first rate ranges from about 10 sccm to about 4000 sccm.

15. The process of claim 13, wherein said dilutant gas comprises nitrogen.

16. The process of claim 7, wherein said step of introducing a second process gas further comprises:
   introducing a fourth process gas comprising a halogen element into the processing chamber.

17. The process of claim 16, wherein said halogen element is fluorine.

18. A process for the deposition of a multi-layer film on a substrate disposed in a processing chamber, said process comprising the steps of:
   introducing $SiH_4$ into the processing chamber at a first rate ranging from about 10 sccm to about 400 sccm;
   introducing $N_2O$ into the processing chamber at a second rate ranging from about 10 sccm to about 3000 sccm;
   introducing $SiF_4$ into the processing chamber at a third rate ranging from about 10 sccm to about 700 sccm;
   striking a first plasma from said $SiH_4$, said $N_2O$, and said $SiF_4$ to deposit a first layer over the substrate, said first plasma having a first plasma density ranging from about 0.12 W/cm$^2$ to about 3.10 W/cm$^2$;
   extinguishing said first plasma;
   evacuating said $SiF_4$ from the processing chamber;
   introducing said $N_2O$ into the processing chamber at a fourth rate ranging from about 10 sccm to about 300 sccm;
   introducing helium into the processing chamber at a fifth rate ranging from about 100 sccm to about 4000 sccm to maintain a pressure ranging from about 2 torr to about 10 torr in the processing chamber, said maintenance of said pressure allowing said first rate to be set at a level which causes a second layer to be deposited at a deposition rate of less than 2000 Å/minute;
   striking a second plasma from said $SiH_4$, said $N_2O$, and said helium to deposit said second layer over said first layer, said second plasma having a plasma density ranging from about 0.12 W/cm$^2$ to about 1.29 W/cm$^2$;
   maintaining said second plasma for a period of time so as to deposit said second layer to a thickness which reduces reflection and refraction of incident radiant energy within a third layer, said third layer being formed over said second layer and said incident radiant energy causing a reaction in said third layer;
   maintaining a temperature within the processing chamber ranting from about 200° C. to about 400° C.; and
   keeping the substrate in the processing chamber throughout said process.

19. A process for the deposition of a multi-layer film on a substrate disposed in a processing chamber, said process comprising the steps of:
   introducing a first process gas comprising silicon, a second process gas comprising oxygen and a third process gas comprising a halogen element into the processing chamber;
   applying energy to said first, said second, and said third process gases to produce reaction of said first. said second. and said third process gases to deposit a first layer comprising silicon, oxygen and a halogen element over the substrate;
   evacuating said third process gas comprising a halogen element from the processing chamber;
   introducing a fourth process gas comprising nitrogen into the processing chamber;
   applying energy to said first, said second, and said fourth process gases to produce reaction of said first, said second, and said fourth process gases to deposit a second layer comprising silicon, oxygen and nitrogen over said first layer without removing the substrate from the processing chamber after said first layer has been deposited;
   controlling the deposition of said second layer to provide a thickness of said second layer which reduces reflection and refraction of incident radiant energy within a third layer;
   forming said third layer over said second layer, said third layer being sensitive to said incident radiant energy;
   exposing a first portion of said third layer to said incident radiant energy using a mask, said mask containing a pattern, said pattern being projected onto said third layer;
   removing a first portion of said third layer, leaving a second portion of said third layer, said second portion of said third layer substantially similar in shape to said pattern; and
   removing a first portion of said second layer and a first portion of said first layer, leaving a second portion of said second layer and a second portion of said first layer, said second portion of said second layer and said second portion of said first layer substantially similar in shape to said second portion of said third layer.

* * * * *